United States Patent [19]
Yamaji

[11] Patent Number: 5,394,303
[45] Date of Patent: Feb. 28, 1995

[54] SEMICONDUCTOR DEVICE

[75] Inventor: Yasuhiro Yamaji, Kawasaki, Japan

[73] Assignee: Kabushiki Kaisha Toshiba, Kawasaki, Japan

[21] Appl. No.: 118,731

[22] Filed: Sep. 9, 1993

[30] Foreign Application Priority Data

Sep. 11, 1992 [JP] Japan .................. 4-243742

[51] Int. Cl.⁶ .................. H05K 1/00; H01L 23/02
[52] U.S. Cl. .................. 361/749; 361/735; 361/736; 174/260; 174/264; 174/52.2; 174/52.4; 257/690; 257/700; 257/777
[58] Field of Search ........ 174/260, 261, 262, 263–266, 174/52.2, 52.4; 361/749, 750, 751, 736, 748, 735; 257/690, 700, 777

[56] References Cited

U.S. PATENT DOCUMENTS

| | | | |
|---|---|---|---|
| 3,039,177 | 6/1962 | Burdett | 361/749 |
| 3,467,892 | 9/1969 | Sprude et al. | 361/749 |
| 4,628,408 | 12/1986 | Kimura | 361/749 |
| 4,833,568 | 5/1989 | Berhold | 361/749 |
| 5,289,346 | 2/1994 | Carey et al. | 361/749 |

Primary Examiner—Bot Ledynh
Attorney, Agent, or Firm—Finnegan, Henderson, Farabow, Garrett & Dunner

[57] ABSTRACT

The present invention comprises a semiconductor chip 1, chip electrodes 2 provided on one surface of the semiconductor chip 1, and connected to semiconductor elements formed in the semiconductor chip, a flexible insulating film 3 wrapping the chip electrodes, wiring layers 5 formed in the insulating film 3, and electrically connected to the chip electrodes 2, and terminal electrodes 6 provided on that surface of the insulating film 3 which extends on the upper surface of the chip 1, the electrodes 6 being electrically connected to the wiring layers 5, and functioning as external terminals of the chip 1. Thus, the terminal electrodes 6 are introduced, by means of the wiring layers 5 formed in the insulating film 3, onto that surface of the insulating film 3 which extends on the upper surface of the chip 1.

8 Claims, 8 Drawing Sheets

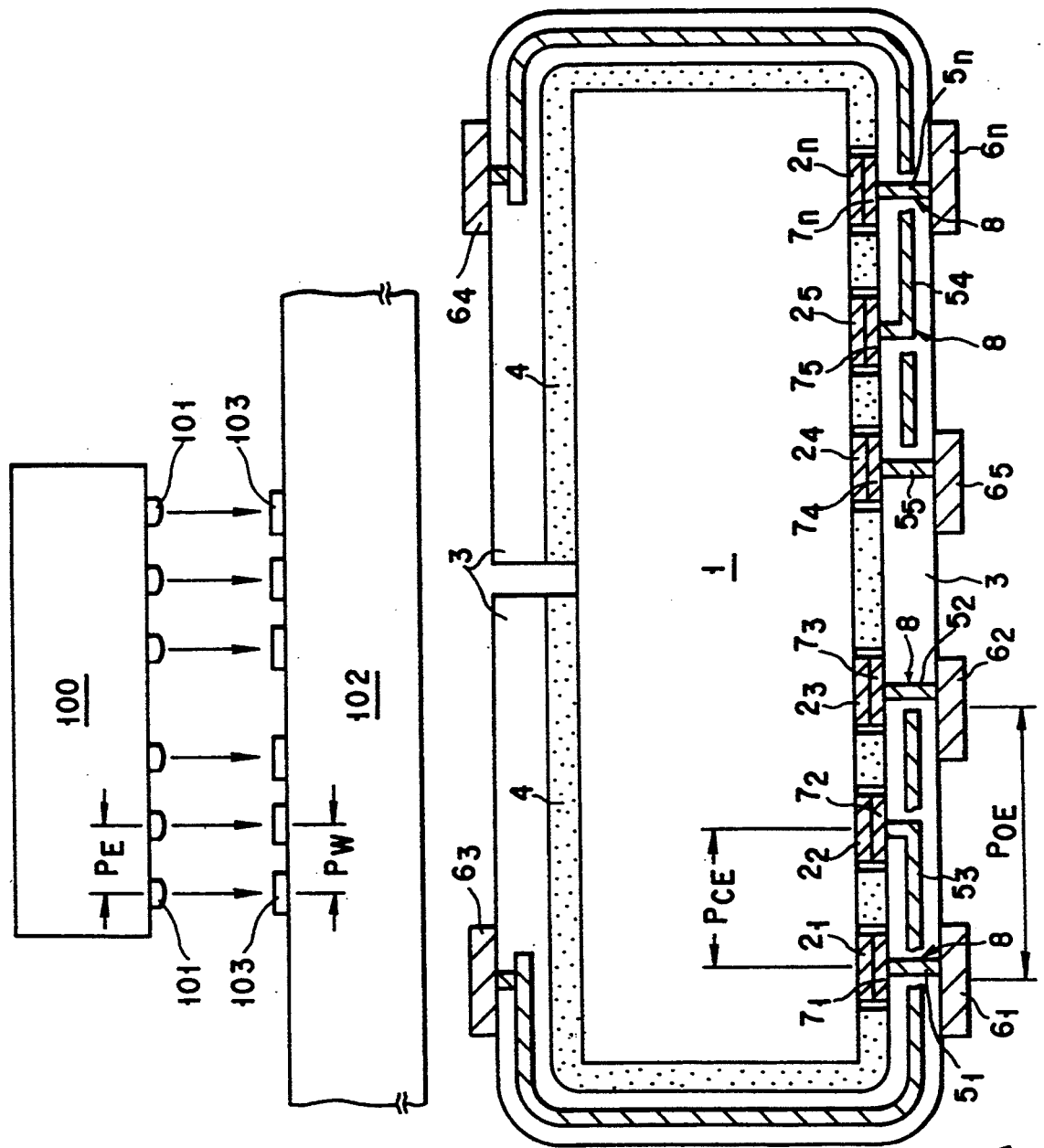

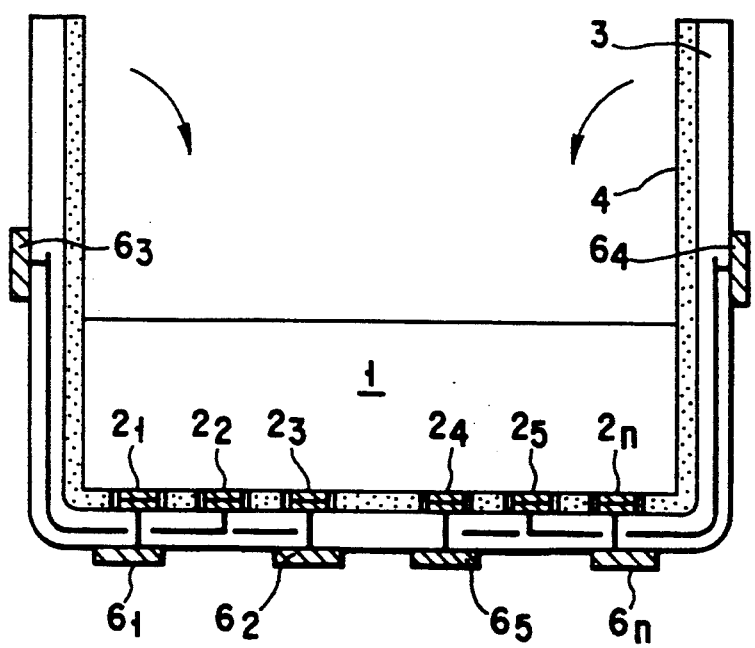
F I G. 3C
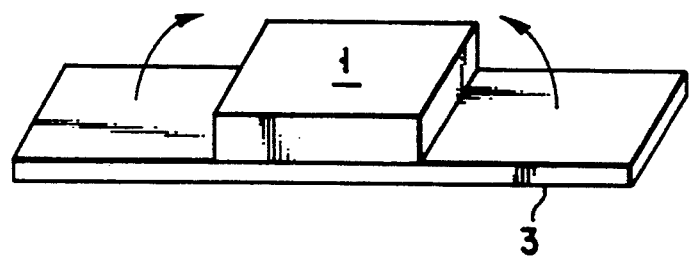
F I G. 3D

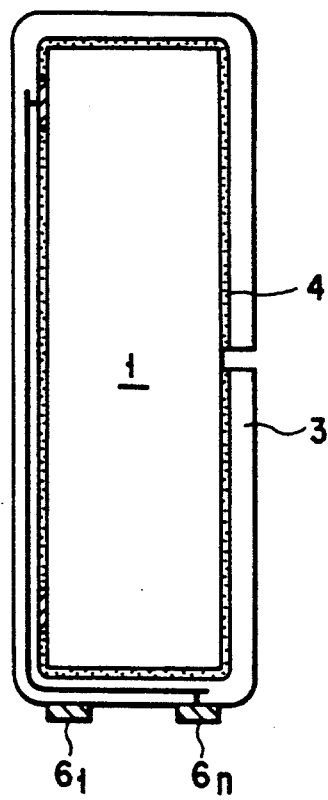
F I G. 5
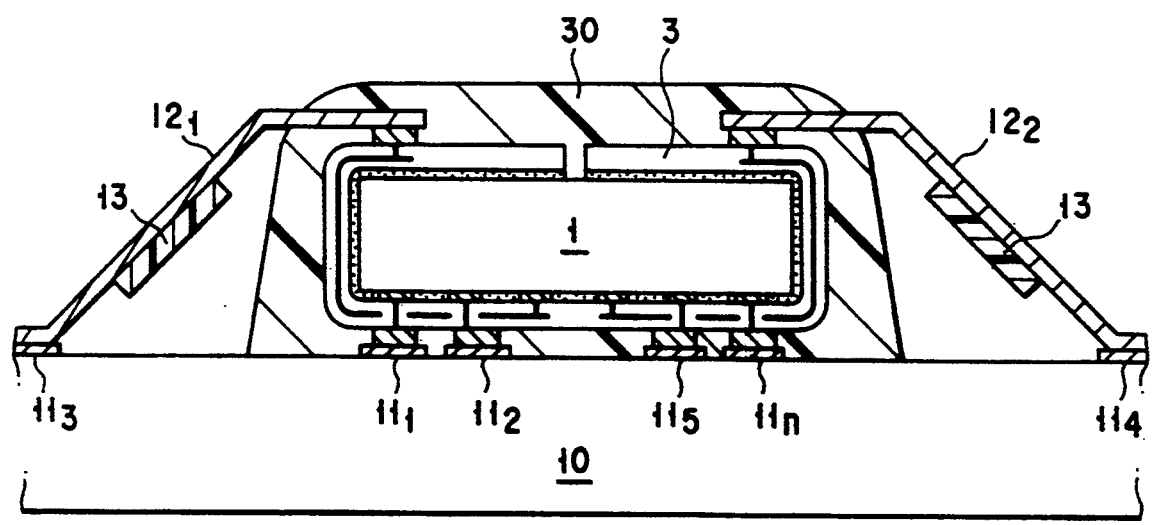
F I G. 6

SEMICONDUCTOR DEVICE

BACKGROUND OF THE INVENTION

1. Field of the Invention

This invention relates to a semiconductor device having a plurality of terminals.

2. Description of the Related Art

The number of terminals incorporated in a semiconductor device has been increased in accordance with an increase in the number of functions employed therein. At present, a semiconductor device which has a greatest number of functions can be made by the use of a flip-chip connecting method.

FIG. 1 is a schematic cross sectional view, showing a device employing the flip-chip connecting method. As is shown in FIG. 1, bump electrodes 101 connected to semiconductor elements (not shown) formed in a semiconductor chip 100 are provided on the chip 100. The electrodes 101 are connected by solder to wires 103 provided on a mounting substrate 102.

The flip-chip connecting method enables a device to have so many terminals. In this case, however, the pitch $P_W$ of the wires 103 on the mounting substrate 102 and the pitch $P_E$ of the bump electrodes 101 on the chip 100 must be set to the same low value. Where the pitches $P_W$ and $P_E$ are set low, a high technique is required to connect the electrodes 101 to the wires 103.

SUMMARY OF THE INVENTION

The present invention has been developed in view of the above circumstances, and its object is to provide a semiconductor device of a structure which facilitates mounting of terminals and enables the number of terminals mounted to be increased.

The semiconductor device according to the present invention is characterized by comprising a semiconductor chip; chip electrodes provided on one surface of the semiconductor chip, and connected to semiconductor elements formed in the semiconductor chip; a flexible insulating film wrapping the chip electrodes; wiring layers formed in the insulating film, and electrically connected to the chip electrodes; and terminal electrodes provided on that surface of the insulating film which extends on the upper surface of the chip, the electrodes being electrically connected to the wiring layers, and functioning as external terminals of the chip.

Thus, the terminal electrodes are introduced, by means of the wiring layers formed in the insulating film, onto that surface of the insulating film which extends on the upper surface of the chip. In other words, the terminal electrodes are located on a plurality of surfaces of the chip. Therefore, the pitch between each adjacent pair of the terminal electrodes can be made large, and hence the terminal electrodes can be mounted with ease. Further, the semiconductor device can have a greater number of terminals since a plurality of surfaces of the chip can be utilized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross sectional view, showing a conventional semiconductor device;

FIGS. 2A and 2B are cross sectional views of a first embodiment of the invention, wherein FIG. 2A shows a semiconductor device, and FIG. 2B shows a state in which the semiconductor of FIG. 2A is mounted on a mounting substrate;

FIGS. 3A to 3C are views, useful in explaining a method for forming the first embodiment shown in FIGS. 2A and 2B;

FIG. 3D is a schematic perspective view, showing the process of forming the structure of FIG. 2B;

FIGS. 4A to 4F are views showing a method for forming a tape carrier film, wherein FIGS. 4A to 4E are perspective views showing each process of forming the tape carrier film, and FIG. 4F is a schematic cross sectional view of a bump electrode formed in the process of FIG. 4E;

FIG. 5 is a cross sectional view, showing a second embodiment of the invention;

FIG. 6 is a cross sectional view, showing a third embodiment of the invention;

FIGS. 7A and 7B show a semiconductor device according to a fourth embodiment of the invention, wherein FIG. 7A is a plan view, and FIG. 7B is a cross sectional view taken along line b—b in FIG. 7A.

DETAILED DESCRIPTION OF THE PREFERRED EMBODIMENTS

Figure 2B:
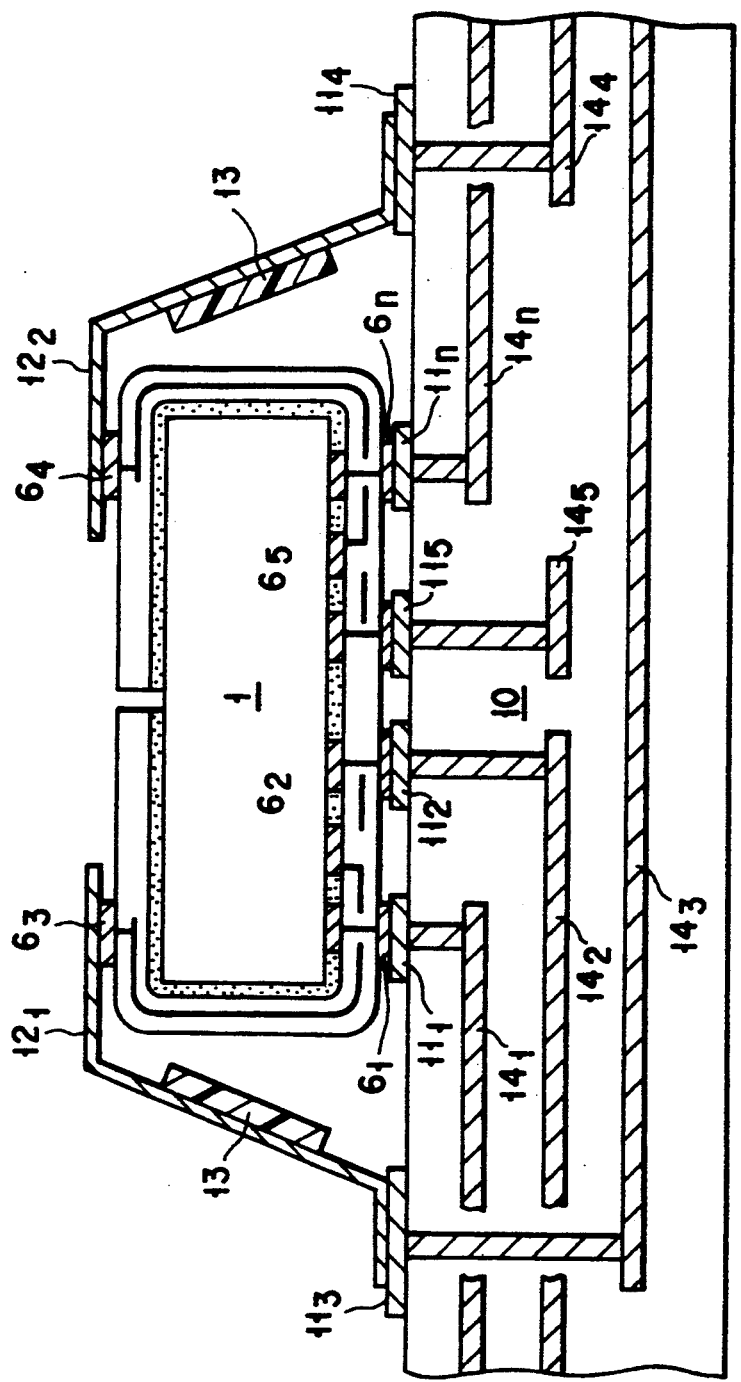

The embodiments of the invention will be explained with reference to the accompanying drawings. Through the overall figures, identical elements are denoted by the same reference numeral, and duplication of an explanation will be avoided.

FIGS. 2A and 2B is a view of a first embodiment of the invention, wherein FIG. 2A shows a semiconductor device, and FIG. 2B shows a state in which the semiconductor of FIG. 2A is mounted on a mounting substrate.

As is shown in FIG. 2A, chip electrode pads $2_1$-$2_n$ are formed on one surface of a semiconductor chip 1, and connected to semiconductor elements (not shown) formed in the chip 1. The chip 1 is coated with a flexible tape carrier film 3 made of polyimide. The film 3 is adhered to the chip 1 by means of an adhesive resin (e.g., an epoxy-based resin adhesive), or an insulating adhesive member 4 such as an adhesive tape. Wires $5_1$-$5_n$ are formed in the film 3. External electrode pads $6_1$-$6_n$ are formed on the outer surface of the film 3, and connected to the wires $5_1$-$5_n$ in the film 3, respectively. The other end of each of the wires $5_1$-$5_n$ are connected to a connection electrode pads $7_1$-$7_n$ formed in the inner surface of the film 3. The connection electrode pads $7_1$-$7_n$ are electrically connected to the chip electrode pads $2_1$-$2_n$, respectively. Thus, the external electrode pads $6_1$-$6_n$ are electrically connected to the chip electrode pads $2_1$-$2_n$ via the wires $5_1$-$5_n$ formed in the film 3. The external electrode pads $6_1, 6_2, 6_5, \ldots, 6_n$ are provided on the lower surface of the chip 1, and connected to the connection electrode pads $7_1, 7_3, 7_4, \ldots$ and $7_n$ by means of the wires $5_1, 5_2, 5_5, \ldots, 5_n$ electrically connected to via-holes $8, \ldots, 8$ formed in the film 3. The other external electrode pads $6_3$ and $6_4$ are provided on the upper surface of the chip 1, and connected to the connection electrode pads $7_2$ and $7_5$ by means of the wires $5_3$ and $5_4$ formed in the film 3. Thus, the film 3 has a multi-layer structure in which the wires $5_1, 5_2, 5_5; \ldots, 5_n$ are formed through layers constituting the film 3. To connect substrate wires $11_1-11_n$ of the mounting substrate 10 to the device having the external electrode pads $6_1-6_n$ provided on the lower and upper surfaces thereof, as is shown in FIG. 2B, two kinds of connecting methods such as a flip-chip connecting method and a tape-carrier connecting method are used simultaneously. Specifically, the external electrode pads $6_1, 6_2, 6_5, \ldots, 6_n$ provided on the lower surface of the chip 1 are connected to the substrate wires $11_1, 11_2, 11_5, \ldots, 11_n$ by the use of the flip-chip connecting method, and the other external electrode pads $6_3$ and $6_4$ provided on the upper surface of the chip 1 are connected to the substrate wires $11_3$ and $11_4$ by the use of the tape-carrier connecting method. In FIG. 2B, reference numerals $12_1$ and $12_2$ denote TAB (Tape Automated Bonding) leads, and reference numeral 13 a carrier tape. To achieve this mounting, he pads $6_1, 6_2, 6_5, \ldots, 6_n$ are designed to be suitable to the flip-chip connecting method, and the pads $6_3$ and $6_4$ to the TAB connecting method. A wire connecting method can be used in place of the TAB connecting method. In this case, pads designed to be suitable to the wire connecting method are used as the external electrode pads $6_3$ and $6_4$. Further, since the device according to the invention can have a large number of terminals, the mounting substrate 10 preferably has a multi-layer structure capable of providing wires of high density.

In the embodiment shown in FIG. 2B, the mounting substrate 10 has a three-layer structure comprising substrate wires $14_1-14_n$.

Then, a method for forming the device shown in FIGS. 2A and 2B will be explained.

Figure 3A:
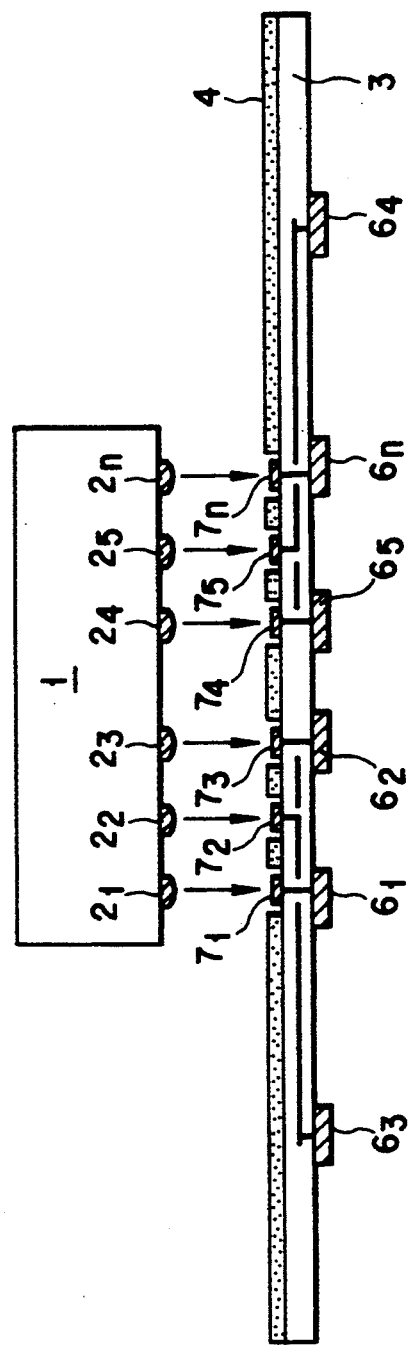
Figure 3B:
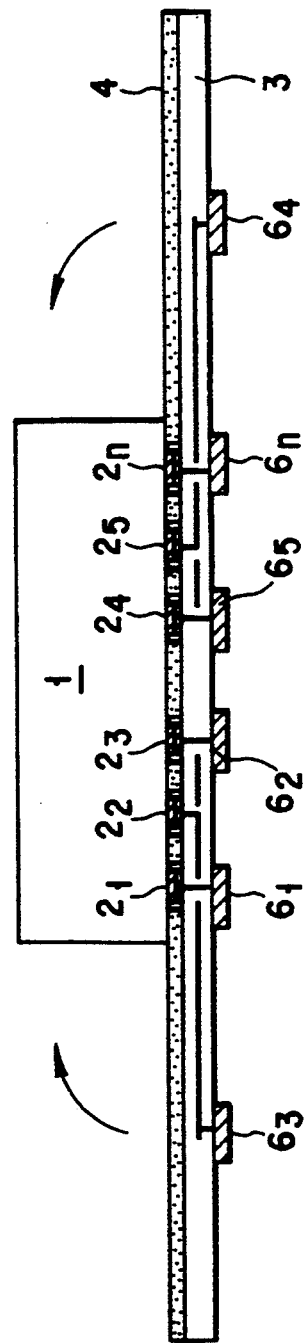

FIGS. 3A-3C are cross sectional views, useful in explaining a method for forming the semiconductor device according to the first embodiment of the invention, while FIG. 3D is a schematic perspective view of the device obtained in the process of FIG. 3B.

First, as is shown in FIG. 3A, the chip electrode pads $2_1-2_n$ of a bump electrode structure are electrically connected to the connection electrode pads $7_1-7_n$ by the use of, for example, solder. This connection process is performed where the tape-carrier film 3 is kept flat.

Thereafter, the film 3 is bent as shown in FIGS. 3B-3D. Since the surface of the film 3 close to the chip 1 is coated with the adhesive member 4, the film 3 and the chip 1 are adhered to each other as a result of bending. The adhesive member 4 may be coated on the chip 1, instead of on the film 3. Then, the film 3 is bent along the upper surface of the chip 1 and fixed thereon, thus providing a device as shown in FIG. 2.

A method for forming the tape carrier film 3 shown in FIGS. 2A and 2B and FIGS. 3A-3C will now be explained.

Figure 4A:
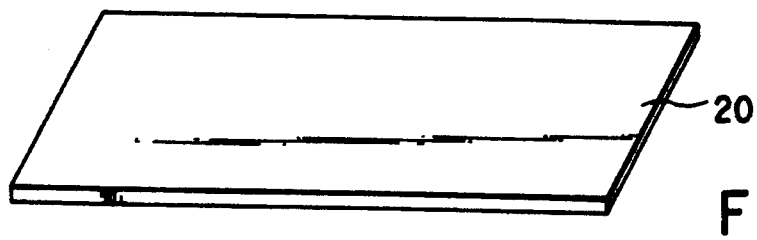
Figure 4B:
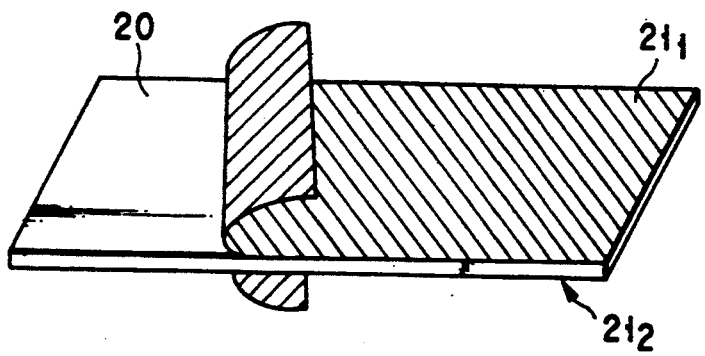
Figure 4C:
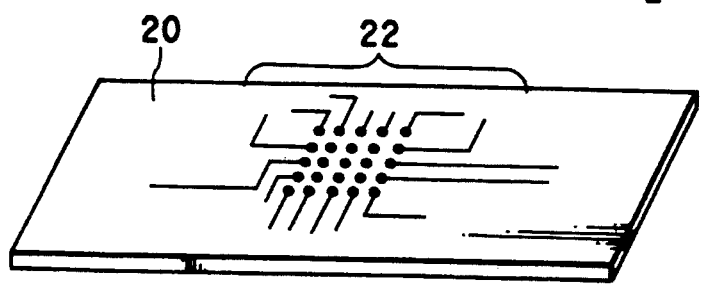
Figure 4D:
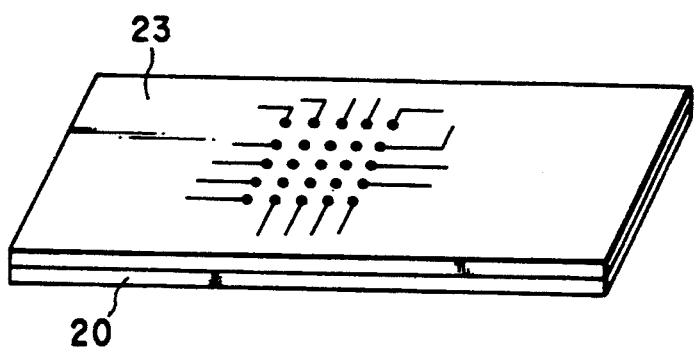
Figure 4E:
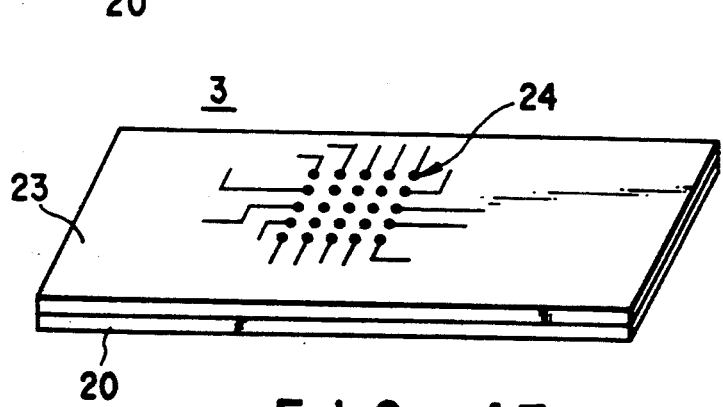
Figure 4F:
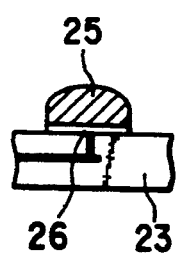

FIGS. 4A-4E are views, useful in explaining a method for forming a film carrier tape, and FIG. 4F is a schematic cross sectional view, showing a bump electrode obtained in the process of FIG. 4A.

First, as is shown in FIG. 4A, a member 20 consisting of an insulating film (tape) made of polyimide, etc. is prepared. Then, the upper and lower surfaces of the member 20 are coated with an epoxy-based resin adhesive.

Thereafter, as is shown in FIG. 4B, copper foils $21_1$ and $21_2$ are adhered to the upper and lower surfaces of the film member 20.

As is shown in FIG. 4C, a pattern 22 which serves as the wires $5_1-5_n$ is formed by patterning the copper foil $21_1$ by etching. Similarly, a pattern (not shown) which serves as the pads $6_1-6_n$ is formed by patterning the copper foil $21_2$ by etching.

Subsequently, as is shown in FIG. 4D, a second film member 23 is adhered to the film member 20.

Then, as is shown in FIG. 4E, bump electrodes 24 which serve as the connection electrode pads $7_1-7_n$ to be connected to the chip are formed after forming of the via-holes, etc. FIG. 4F is a cross sectional view of the bump electrode 24. As is shown in FIG. 4F, the electrode 24 consists of a copper foil pattern 26 formed on the film member 23, and a metal plate 25 formed on the pattern 26. The metal plate 25 is formed by the use of, for example, gold, solder, etc.

The tape carrier film 3 is formed as described above.

FIG. 5 is a cross sectional view, showing a semiconductor device according to a second embodiment of the invention.

As is shown in FIG. 5, the external electrode pads $6_1-6_n$ are provided on a side surface of the chip 1.

Arranging the pads $6_1-6_n$ on the side surface of the chip 1 enables the semiconductor device to be mounted on the mounting substrate at right angles thereto, thereby enhancing the density of mounted elements.

FIG. 6 is a cross sectional view, showing a semiconductor device according to a third embodiment of the invention.

As is shown in FIG. 6, a sealing resin 30 is coated on the overall surface (or part of the surface) of the semiconductor device mounted on the mounting substrate 10.

Coating the overall surface or part of the surface of the semiconductor device with the sealing resin 30 can further enhance the electrical insulation of the device and the excess moisture tolerance of the same.

Figure 7A:
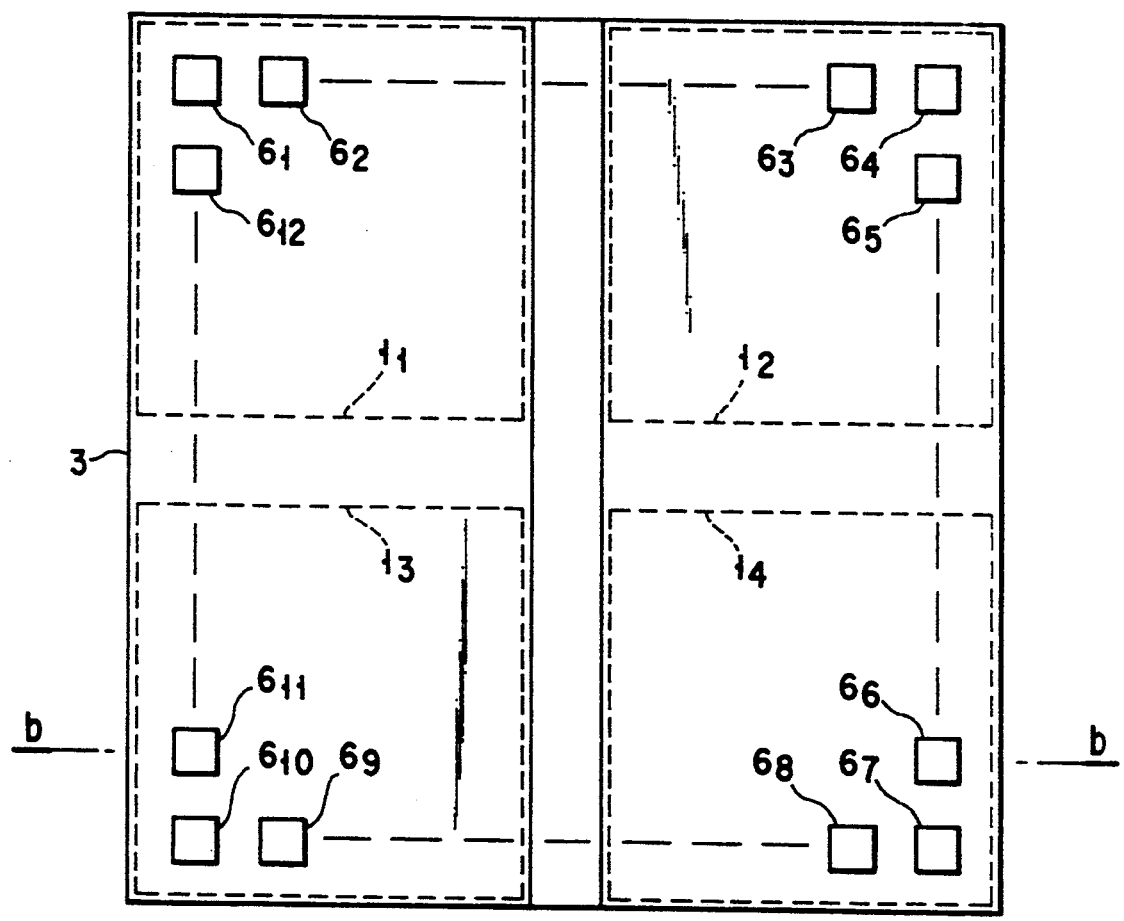
Figure 7B:
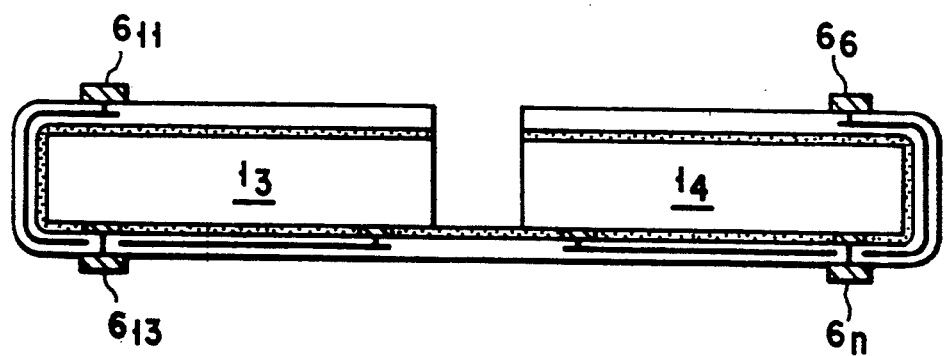

FIGS. 7A and 7B show a semiconductor device according to a fourth embodiment. FIG. 7A is a plan view, and FIG. 7B is a cross sectional view, taken along line b—b of FIG. 7A.

As is shown in FIGS. 7A and 7B, the tape carrier film 3 wraps a plurality of chips $1_1-1_4$. The external electrode pads $6_1-6_n$ are electrically connected to the chips $1_1-1_4$, thus forming a multi-chip module.

Thus, a multi-chip type semiconductor device can be formed by wrapping the chips $1_1-1_4$ with the film 3, thereby to enhance the density of elements mounted in the device and to increase the number of functions employed in the device.

Figure 8:
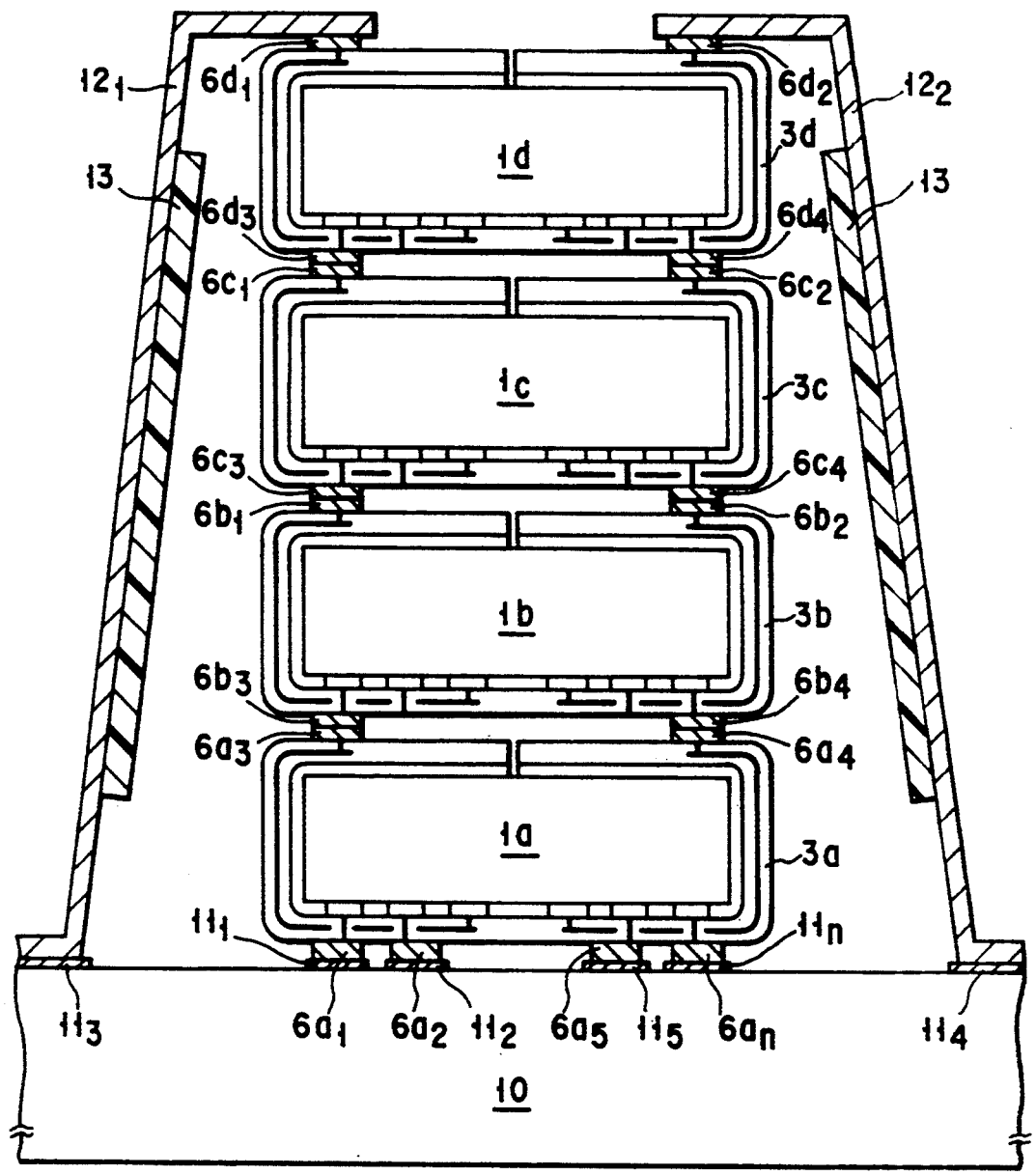
FIG. 8 is a cross sectional view, showing a fifth embodiment of the invention.

FIG. 8 is a cross sectional view, showing a semiconductor device according to a fifth embodiment of the invention.

As is shown in FIG. 8, a first chip 1a wrapped with a first film 3a, a second chip 1b wrapped with a second film 3b, $\ldots$, and a fourth chip 1d wrapped with a fourth film 3d are laminated on the mounting substrate 10 in this order. External electrode pads $6_{a1}, 6_{a2}, 6_{a5}, \ldots, 6_{an}$ provided on the lower surface of the first chip 1a are electrically connected to substrate wires $11_{a1}, 11_{a2}, 11_{a5},$ ..., $11_{an}$, respectively. External electrode pads $6_{a3}$ and $6_{a4}$ provided on the upper surface of the first chip 1a are electrically connected to external electrode pads $6_{b3}$ and $6_{b4}$ provided on the lower surface of the second chip 1b, respectively. External electrode pads $6_{b1}$ and $6_{b2}$ provided on the upper surface of the second chip 1b are electrically connected to external electrode pads $6_{c3}$ and $6_{c4}$ provided on the lower surface of the third chip 1c, respectively. Similarly, external electrode pads $6_{c1}$ and $6_{c2}$ provided on the upper surface of the third chip 1c are electrically connected to external electrode pads $6_{d3}$ and $6_{d4}$ provided on the lower surface of the fourth chip 1d, respectively. External electrode pads $6_{d1}$ and $6_{d2}$ provided on the upper surface of the fourth chip 1d are connected to substrate wires $11_3$ and $11_4$ via the TAB leads $12_1$ and $12_2$, respectively.

As described above, laminating the chips 1a–1d on the mounting substrate 10 can provide a multi-chip type semiconductor device. Further, in the fifth embodiment, it is not always necessary to electrically connect the uppermost chip 1d to the substrate wires 11. This is because the lowermost chip 1a is electrically connected to the substrate wires 11, and hence each of the chips 1a–1d is electrically connected to the substrate wires 11.

In the semiconductor device of the above-described embodiments, electrode pads are provided on a plurality of surfaces of a semiconductor chip by the use of wires formed in a film, which differs from the conventional case in which electrode pads are provided on a single surface of the semiconductor device. Accordingly, as is shown in FIGS. 2A and 2B, a pitch PCE between each adjacent pair of internal electrode pads can be made smaller than a pitch POE between each adjacent pair of external electrode pads. Therefore, the semiconductor device can be mounted more easily, and can have more terminals.

In addition, in the above-described embodiments, chips are coated with the film 3, and hence have a higher moisture resistance than a bare chip mounted in the conventional semiconductor device which employs the flip-chip connecting method or the TAB connecting method, too.

The present invention is not limited to the above-described embodiments, but may be modified in various manners. For example, although in the embodiments, two portions of the film 3 are bent as shown in FIG. 3B, one, three or four portions of the film 3 may be bent.

Moreover, it is a matter of course that a method for forming the film 3 is not limited to the above-described one, but the film 3 formed by another method and made of one of various materials can be used.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
   semiconductor chip having first and second opposite major surfaces;
   a plurality of chip electrode pads on the first major surface of the semiconductor chip, wherein the distances between adjacent chip electrode pads are approximately equal and define a chip electrode pitch;
   a flexible insulating film wrapping the chip;
   a wiring layer within the insulating film, and electrically connected to the chip electrode pads by means of via-holes; and
   external electrode pads electrically connected to the chip electrode pads by means of the wiring layer and the via-holes, and functioning as external terminals of the chip electrode pads, wherein the average of the distances between adjacent external electrode pads, measured along the insulating film, is greater than the chip electrode pitch.

2. The semiconductor device according to claim 1, wherein the wiring layer of the insulating film consists of at least one layer.

3. A semiconductor device comprising:
   a semiconductor chip having first and second opposite major surfaces;
   a plurality of chip electrode pads on the first major surface of the semiconductor chip, wherein the distances between adjacent chip electrode pads are approximately equal and define a chip electrode pitch;
   a flexible insulating film wrapping the chip;
   a wiring layer, consisting of at least one layer, within the insulating film, and electrically connected to the chip electrode pads by means of via-holes; and
   external electrode pads electrically connected to the chip electrode pads by means of the wiring layer and the via-holes, and functioning as external terminals of the chip electrode pads, wherein the average distance between the external electrode pads that are adjacent the first major surface is greater than the chip electrode pitch.

4. The semiconductor device according to claim 1 or 3, wherein at least one of the external electrode pads is formed adjacent to the second major surface of the semiconductor chip.

5. The semiconductor device according to claim 1 or 3, wherein at least one of the external electrode pads is formed on a side surface of the semiconductor chip.

6. The semiconductor device according to claim 1 or 3, wherein the semiconductor chip comprises a plurality of chips.

7. A semiconductor device comprising:
   a semiconductor chip having first and second opposite major surfaces;
   a plurality of chip electrode pads on the first major surface of the semiconductor chip;
   a flexible insulating film wrapping the chip, the insulating film containing a wiring layer; and
   a plurality of external electrode pads on the surface of the insulating film, each of the plurality of external electrode pads corresponds to and is electrically connected by the wiring layer to one of the plurality of chip electrode pads, wherein the distance between substantially every adjacent pair of external electrode pads is greater than the distance between the corresponding pair of chip electrode pads, the distances being measured along the insulating film.

8. The semiconductor device according to claim 7, wherein the wiring layer includes at least one layer.

* * * * *

UNITED STATES PATENT AND TRADEMARK OFFICE
CERTIFICATE OF CORRECTION

PATENT NO. : 5,394,303
DATED : February 28, 1995
INVENTOR(S) : Yasuhiro YAMAJI

It is certified that error appears in the above-indentified patent and that said Letters Patent is hereby corrected as shown below:

Claim 1, Column 5, Line 62 insert --a-- before "semiconductor".

Signed and Sealed this

Eighteenth Day of July, 1995

BRUCE LEHMAN

Attest:

Attesting Officer

Commissioner of Patents and Trademarks